(12) United States Patent
Fertig et al.

(10) Patent No.: US 9,083,363 B2
(45) Date of Patent: Jul. 14, 2015

(54) SYSTEMS AND METHODS FOR A COLD ATOM FREQUENCY STANDARD

(71) Applicant: Honeywell International Inc., Morristown, NJ (US)

(72) Inventors: Chad Fertig, Bloomington, MN (US); Chad Langness, Robbinsdale, MN (US); Karl D. Nelson, Plymouth, MN (US); Kenneth Salit, Plymouth, MN (US); Jennifer S. Strabley, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 14/084,819

(22) Filed: Nov. 20, 2013

(65) Prior Publication Data

US 2015/0022273 A1    Jan. 22, 2015

Related U.S. Application Data

(60) Provisional application No. 61/856,914, filed on Jul. 22, 2013.

(51) Int. Cl.
*H03B 17/00* (2006.01)
*H03L 7/26* (2006.01)
*G04F 5/14* (2006.01)

(52) U.S. Cl.
CPC ... *H03L 7/26* (2013.01); *G04F 5/14* (2013.01)

(58) Field of Classification Search
CPC ........................................ H03B 17/00
USPC ..................................... 331/3, 94.1
See application file for complete search history.

(56) References Cited

U.S. PATENT DOCUMENTS

| | | | |
|---|---|---|---|
| 6,215,366 B1 * | 4/2001 | Kern et al. | 331/94.1 |
| 6,225,870 B1 | 5/2001 | Mei et al. | |
| 7,030,704 B2 | 4/2006 | White | |
| 7,944,317 B2 | 5/2011 | Strabley et al. | |
| 8,237,105 B1 | 8/2012 | Bulatowicz et al. | |
| 2006/0051213 A1 * | 3/2006 | Touchberry et al. | 417/48 |

(Continued)

OTHER PUBLICATIONS

Stefanucci et al., "Compact microwave cavity for high performance rubidium frequency standards", "Review of Scientific Instruments", 2012, vol. 83, Publisher: American Institute of Physics.
Violetti et al., "New Miniaturized Microwave Cavity for Rubidium Atomic Clocks", 2012, pp. 315-318, Publisher: IEEE, Published in: CH.

(Continued)

*Primary Examiner* — Joseph Chang
*Assistant Examiner* — Jeffrey Shin
(74) *Attorney, Agent, or Firm* — Fogg & Powers LLC (57) ABSTRACT

Systems and methods for a cold atom frequency standard are provided herein. In certain embodiments, a cold atom microwave frequency standard includes a vacuum cell, the vacuum cell comprising a central cylinder, the central cylinder being hollow and having a first open end and a second open end; a first end portion joined to the first open end; and a second end portion joined to the second open end, wherein the first end portion, the central cylinder, and the second end portion enclose a hollow volume containing atoms, the first end portion and the second end portion configured to allow light to enter into the hollow volume. The cold atom microwave frequency standard also includes a cylindrically symmetric resonator encircling the central cylinder, wherein the resonator generates a microwave field in the hollow volume at the resonant frequency of the atoms.

17 Claims, 6 Drawing Sheets

(56) References Cited

U.S. PATENT DOCUMENTS

2010/0033255 A1*  2/2010  Strabley et al. .............. 331/94.1
2010/0033256 A1*  2/2010  Strabley et al. .............. 331/94.1
2010/0111750 A1*  5/2010  Touchberry et al. .......... 420/400

OTHER PUBLICATIONS

Xia et al., "Characteristics of a Novel Kind of Miniaturized Cavity-Cell Assembly for Rubidium Frequency Standards", "IEEE Transations on Instrumentation and Measurement", Jun. 2006, pp. 1000-1005, vol. 55, No. 3, Publisher: IEEE.

* cited by examiner

SYSTEMS AND METHODS FOR A COLD ATOM FREQUENCY STANDARD

CROSS-REFERENCE TO RELATED APPLICATIONS

This application claims the benefit of U.S. Provisional Patent Application Ser. No. 61/856,914 filed on Jul. 22, 2013, which is hereby incorporated herein by reference.

STATEMENT REGARDING FEDERALLY SPONSORED RESEARCH OR DEVELOPMENT

This invention was made with Government support under contract No. W31P4Q-09-C-0348 awarded by DARPA. The Government has certain rights in the invention.

BACKGROUND

Atomic frequency standards (atomic clocks) are some of the most stable frequency references available. Due to the stability offered by atomic clocks, atomic clocks are frequently used in multiple applications that demand stable frequency references. However, high performance atomic clocks have traditionally been relatively large rack mounted or table top devices. Thus, efforts are under way to reduce the size of atomic clocks such as by reducing the physics package of atomic clocks and other sensors which utilize cold atom clouds as the sensing element.

Making the physics package smaller has unique and complex challenges because the physics package must be hermetically sealed, permit the introduction of light into its interior, and be constructed of non-magnetic materials. In certain methods of manufacturing a physics package, a glass body is machined with multiple holes for placement of mirrors and windows on its exterior, and a plurality of angled borings that serve as light paths to trap, cool, and manipulate the cold atomic sample.

In general, a laser cooled atomic clock operates by trapping and manipulating atoms with light beams from one or more lasers and magnetic confining fields generated by one or more conductive bodies. The physics package defines a vacuum sealed chamber that holds the atoms that are manipulated and measured. The atoms within the physics package are trapped within the volume such that the multiple light paths intersect with the atoms from different angles. Developing a small volume physics package which allows for large optical beams and added-flexibility of a multi-beam configuration is important to the development of high performance miniature atomic physics packages. However, smaller size requirements for atomic clocks present challenges for current building techniques.

SUMMARY

Systems and methods for a cold atom frequency standard are provided herein. In certain embodiments, a cold atom microwave frequency standard includes a vacuum cell, the vacuum cell comprising a central cylinder, the central cylinder being hollow and having a first open end and a second open end; a first end portion joined to the first open end; and a second end portion joined to the second open end, wherein the first end portion, the central cylinder, and the second end portion enclose a hollow volume containing atoms, the first end portion and the second end portion configured to allow light to enter into the hollow volume. The cold atom microwave frequency standard also includes a cylindrically symmetric resonator encircling the central cylinder, wherein the resonator generates a microwave field in the hollow volume at the resonant frequency of the atoms.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Systems and methods for a cold atom frequency standard (atomic clock) are provided. As described below, cold atom atomic clocks function by trapping atoms within a vacuum sealed chamber and measuring characteristics of the atoms. For example, spectroscopic measurements of the trapped atoms can be used as a reference frequency in a timing system. As described in the present disclosure, a vacuum cell is mounted within a cylindrically symmetric resonator, where the vacuum cell admits laser beams that cool/trap atoms at particular locations within the vacuum cell. In at least one implementation, faceted windows on the vacuum cell permit the introduction of laser beams into the vacuum cell that fits within the resonator. Further, the resonator encircles the vacuum cell and, when operating, generates a persistent microwave field through the middle of the vacuum cell. As described above, the systems and methods apply to cold atom atomic clocks. The embodiments described above and further below also generally apply to cold atom sensors.

Figure 1:
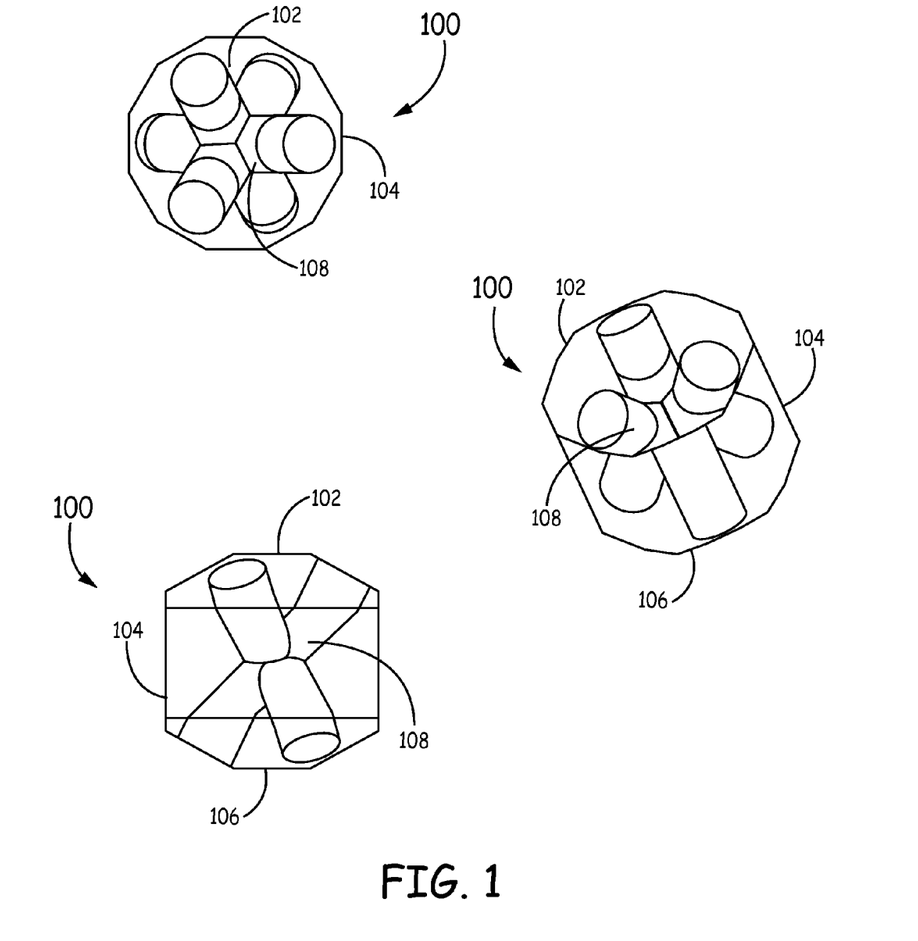
FIG. 1 is a drawing illustrating multiple views of a vacuum cell in one embodiment described in the present disclosure.

FIG. 1 is a drawing illustrating multiple views of a vacuum cell 100. In certain embodiments, the vacuum cell 100 includes a central cylinder 104, a first end portion 102 and a second end portion 106. The central cylinder 104 is a hollow open-ended cylinder that encircles an enclosed volume 108.

In at least one implementation, the central cylinder 104 is fabricated from a rigid material that does not impede the transmission of radio frequency (RF) energy through the material. For example, the central cylinder 104 may be fabricated from glass, silicon, ceramic, and the like.

In contrast to the central cylinder 104, the first end portion 102 and the second end portion 106 are fabricated from a material that is transparent and does not strongly absorb light as it passes through the first end portion 102 and the second end portion 106. For example, the first end portion 102 and the second end portion 106 may be fabricated from glass or other material that allows for the passage of light through the material. In at least one implementation, portions of the first end portion 102 and the second end portion 106 that allow light to pass through are polished to further reduce the possibility that material in the first end portion 102 and the second end portion 106 interact with light that directly passes through the first end portion 102 and the second end portion 106. In at least one implementation, one of the first end portion 102 and the second end portion 106 is fabricated as part of the central cylinder 104.

In certain embodiments, the first end portion 102 and the second end portion 106 are joined to opposite ends of the central cylinder 104 such that the combination of the central cylinder 104, the first end portion 102, and the second end portion 106 fully enclose the enclosed volume 108 within the vacuum cell 100. Further, when the first end portion 102 and the second end portion 106 are joined to the central cylinder 104, the first end portion 102 and the second end portion 106 are bonded to the central cylinder 104 such that the enclosed volume 108 is hermetically sealed within the vacuum cell 100. For example, the first end portion 102 and the second end portion 106 are joined to the central cylinder 104 using a frit. Generally, the first end portion 102 and the second end portion 106 may be joined to the central cylinder 104 by a material or bonded using a method that is able to form a hermetic seal and maintain the hermetic seal during the operation of the atomic clock. In at least one implementation, a getter is formed in a getter tube that is attached to the vacuum cell 100, where the getter tube helps preserve the vacuum after fabrication. Getter tubes are shown in U.S. patent application Ser. No. 13/231,438 entitled "SYSTEMS AND METHODS FOR GETTERING AN ATOMIC SENSOR", which is incorporated herein by reference.

In certain embodiments, when the vacuum cell 100 functions as part of a cold atom sensor, the enclosed volume 108 contains atoms that are cooled by laser light that is introduced into the enclosed volume 108. For example, the enclosed volume 108 may contain rubidium atoms or another atom that has the characteristics that allow the atom to function in an atomic clock. To introduce the light into the enclosed volume 108, the light is introduced through the first end portion 102, the second end portion 106, or both the first end portion 102 and the second end portion 106. In certain embodiments, the light sources are arranged about the vacuum cell such that light introduced into the enclosed volume 108 at light ports 110 will intersect each other at ninety degree angles. The light that is introduced into the enclosed volume 108 collects atoms from a background vapor or other source of hot atoms, then cools and compresses the collected atoms to form a sample whose properties are to be measured for the operation of the atomic clock. In at least one implementation, the light is extinguished during the period of time during which the properties of the atoms are measured.

Figure 2:
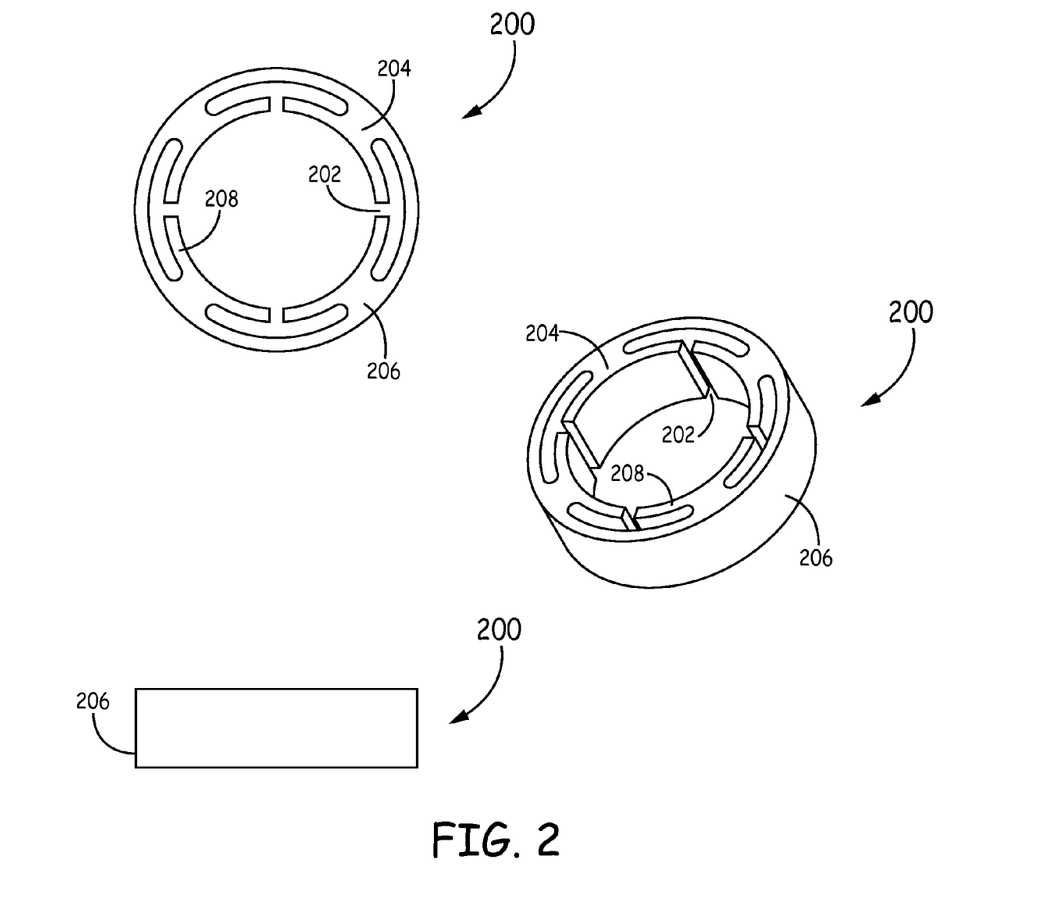
FIG. 2 is a drawing illustrating multiple views of a resonator in one embodiment described in the present disclosure.

FIG. 2 is a drawing illustrating multiple views of a resonator 200. The resonator 200 provides a persistent microwave field within a resonant cavity. In certain implementations, the resonator 200 is a loop gap resonator. When the resonator 200 is a loop gap resonator, the resonator 200 comprises supports 204, electrodes 208, shield 206, and gaps 202. For example, the resonator 200 includes a metallic slotted loop inside a cylindrical shield 206, where the loop is formed by electrodes 208 that are separated along the loop by gaps 202, where the loop is supported by supports 204 that connect the electrodes 208 to the shield 206. Within the resonator 200, the resonator 200 is able to create a microwave field. Further, the shape of the resonator 200 determines the frequency of the microwave fields that resonate. For example, the size of the gaps 202, the length of the supports 204, the circumference of the shield 206, and the size of the electrodes 208 determine the frequency of resonant microwave fields.

Figure 3:
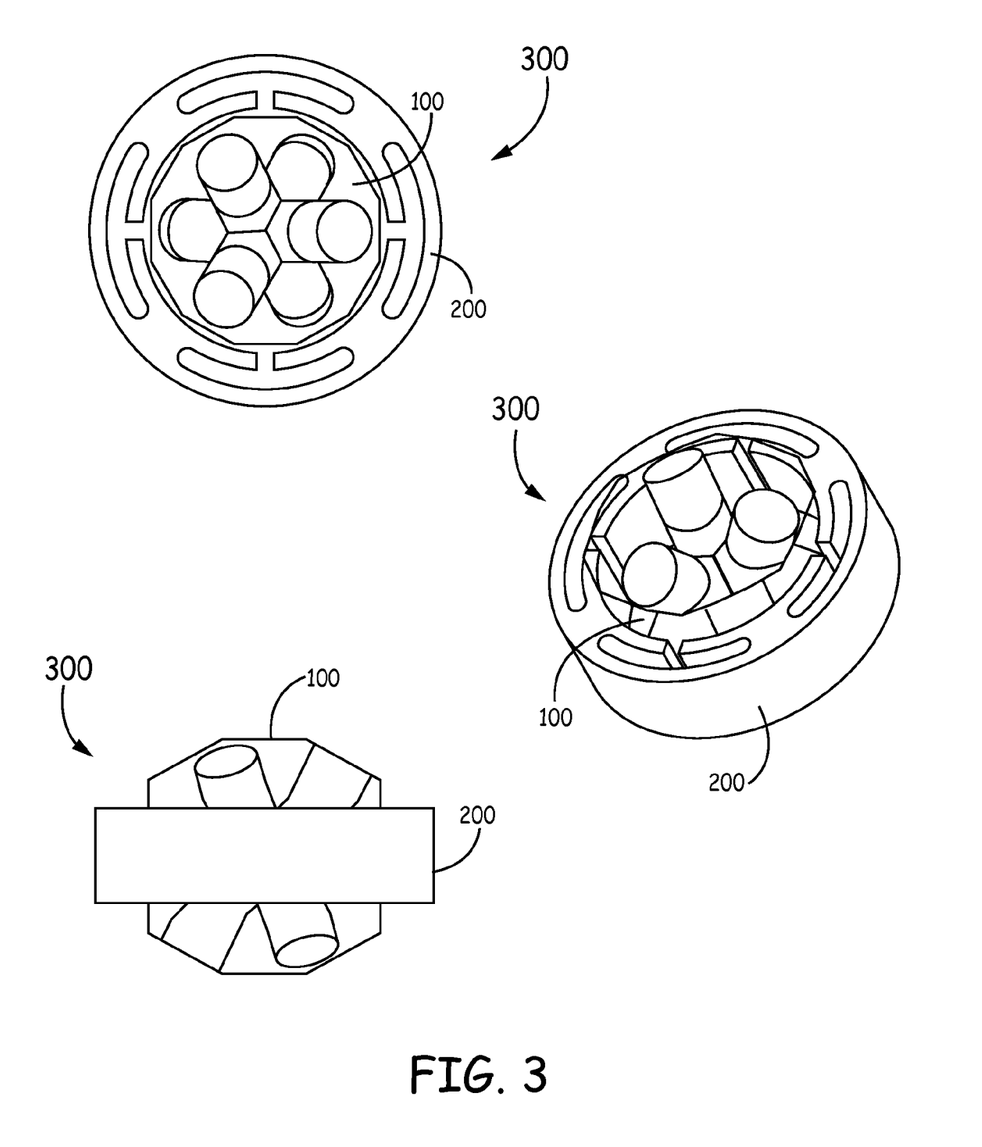
FIG. 3 is a drawing illustrating multiple views of a physics package in one embodiment described in the present disclosure.

In certain implementations, as shown in FIG. 3, the vacuum cell 100 may be placed within the resonator 200 to form a physics package 300. As shown in FIG. 3, the resonator 200 is an open ended resonator, where the resonator 200 encircles the central cylinder 104 of the vacuum cell 100. The resonator 200 generates a microwave field within the vacuum cell 100 that probes the atoms that are within the vacuum cell 100. Further, the resonator 200 allows the first end portion 102 and the second end portion 106 to be exposed to multiple lasers at different angles to trap atoms inside the vacuum cell 100. Further, because the physics package is implemented as a cold atom sensor, the resonator 200 produces a microwave field with uniform, linear polarization along the axis of the resonator and homogenous spatial phase throughout the volume within the resonator 200 and within the vacuum cell 100 In at least one implementation, where the atoms within the vacuum cell are rubidium atoms, the resonator 200 generates a microwave field having a frequency of 6.835 GHz within the vacuum cell 100, where the generated frequency is the resonant frequency of the atoms' ground state hyperfine transition, commonly used as a clock transition in microwave clocks.

Figures 4A, 4B:
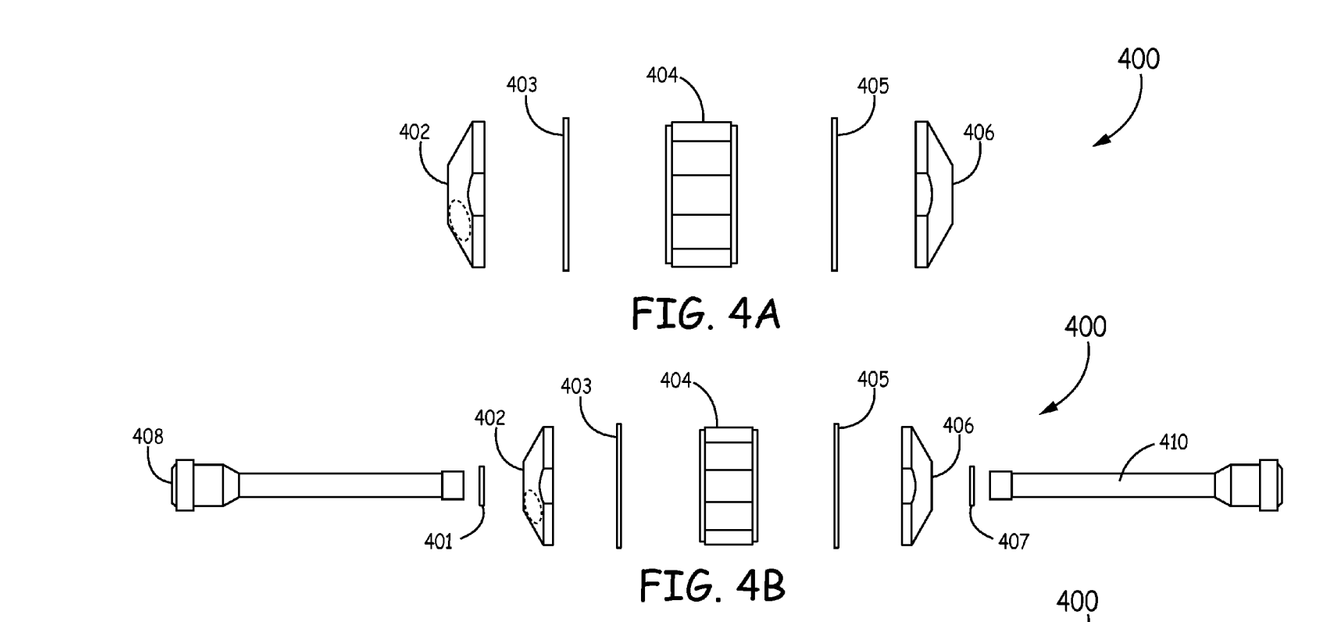
FIGS. 4A-4C illustrate several views of the fabrication of a vacuum cell in one embodiment described in the present disclosure.
Figure 4C:
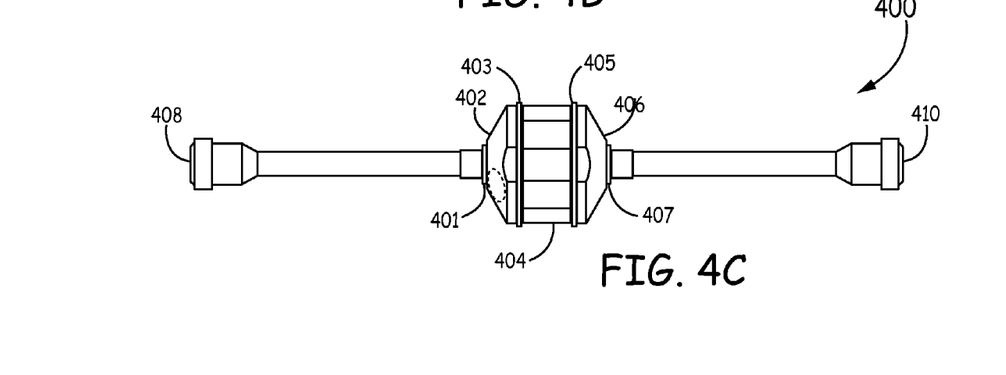

FIGS. 4A-4C illustrate several views of the fabrication of a vacuum cell 400. For example, FIG. 4A illustrates an exploded view of a vacuum cell 400, where vacuum cell 400 is similar to vacuum cell 100 in FIG. 1. Vacuum cell 400 includes a first end portion 402, a central cylinder 404, and a second end portion 406 that function in a similar manner to first end portion 102, central cylinder 104, and second end portion 106 in FIG. 1. As illustrated, the first end portion 402 is bonded to a side of the central cylinder 404 through a first frit seal 403. The second end portion 406 is likewise bonded to an opposite side of the central cylinder 404 through a second frit seal 405. During processing, the first frit seal 403 and the second frit seal 405 are heated such that the first frit seal 403 and the second frit seal 405 melt and hermetically seal the first end portion 402 and the second end portion 406 to opposite sides of the central cylinder 404. In an alternative implementation, the first end portion 402 and second end portion 406 are bonded to the central cylinder 404 through means other than a frit seal, such as anodic bonding and the like.

FIG. 4B illustrates the mounting of vacuum tubes of vacuum cell 400. In certain implementations, vacuum cell 400 may include a first vacuum tube 408 and a second vacuum tube 410. The first vacuum tube 408 and second vacuum tube 410 aid in evacuating the air from the vacuum cell 400 and also in maintaining the vacuum within the vacuum cell 400. Further, one of the first vacuum tube 408 and the second vacuum tube 410 may function as a fill tube for introducing an atomic source into the evacuated vacuum cell 400. For example, when a vacuum tube functions as a fill tube, the vacuum tube may contain an atomic source or reservoir within the vacuum tube. Upon evacuation of air from the vacuum cell through the vacuum tube that does not contain the atomic source, the fill tube may be crushed to introduce the atomic source into the vacuum cell. The introduced atomic source may then release atoms, where the released atoms are then trapped and manipulated by light beams within the vacuum cell 400. In at least one embodiment, the first vacuum tube 408 is bonded to the first end portion 402 through a first vacuum frit seal 401. Likewise, the second vacuum tube 410 is bonded to the second end portion 406 through a second vacuum frit seal 407. FIG. 4C illustrates the vacuum cell 400 when the different components of vacuum cell 400 are bonded to one another. As illustrated, the vacuum cell 400 connects to two vacuum tubes, however, in alternative implementations; the vacuum cell 400 may connect to larger quantity of vacuum tubes. Vacuum tubes are further described in U.S. patent application Ser. No. 12/263,186 entitled "METHODS FOR INTRODUCTION OF A REACTIVE MATERIAL INTO A VACUUM CHAMBER", which is incorporated herein by reference.

Figure 5:
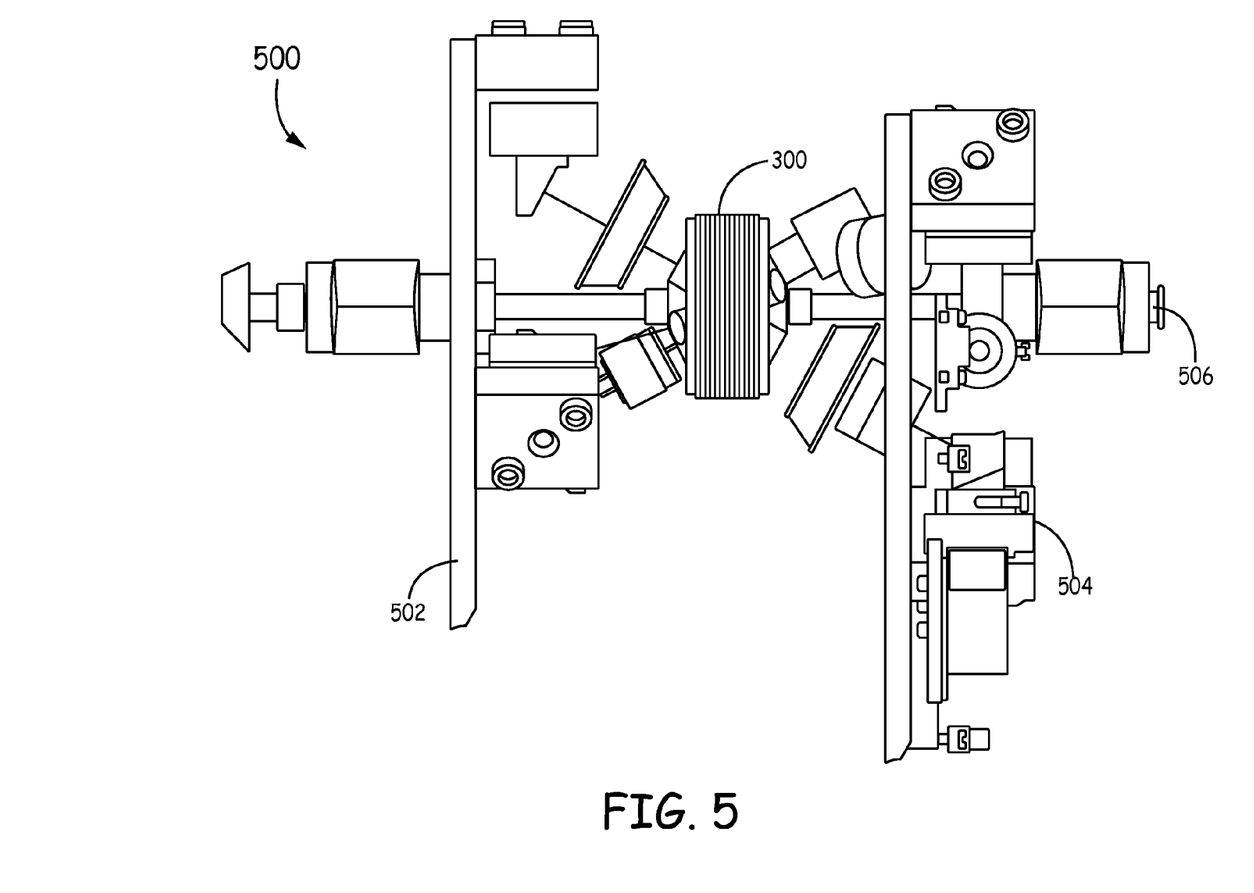
FIG. 5 is a drawing of a mounting system for an atomic clock in one embodiment described in the present disclosure.

FIG. 5 illustrates one exemplary implementation of a structure 500 that is used to hold the physics package 300. For example, the structure 500 includes a rigid frame 502 having a vacuum connection 506. The vacuum connection 506 connects to a vacuum tube that extends away from the vacuum cell 100 to pump air out of the vacuum cell. Further, frame 502 includes functional fixtures 504 that control light and signals that are provided to the physics package 300. For example, functional fixtures 504 include laser beams, beam splitters, reflectors, support electronics, and the like. For example, the functional fixtures 504 direct the light beams (such as lasers) into the vacuum cell 100 such that the light beams intersect at right angles within the physics package and trap the atoms at the location where the light beams intersect. Also, the functional fixtures 504 may include a coupling loop, and possible tuning elements, which drive the resonator 200 to provide the desired microwave field within the physics package 300 as described above. In a further embodiment, the structure 500 may include a coupling element that secures the location of the vacuum cell 100 in relation to the resonator 200.

Figure 6:
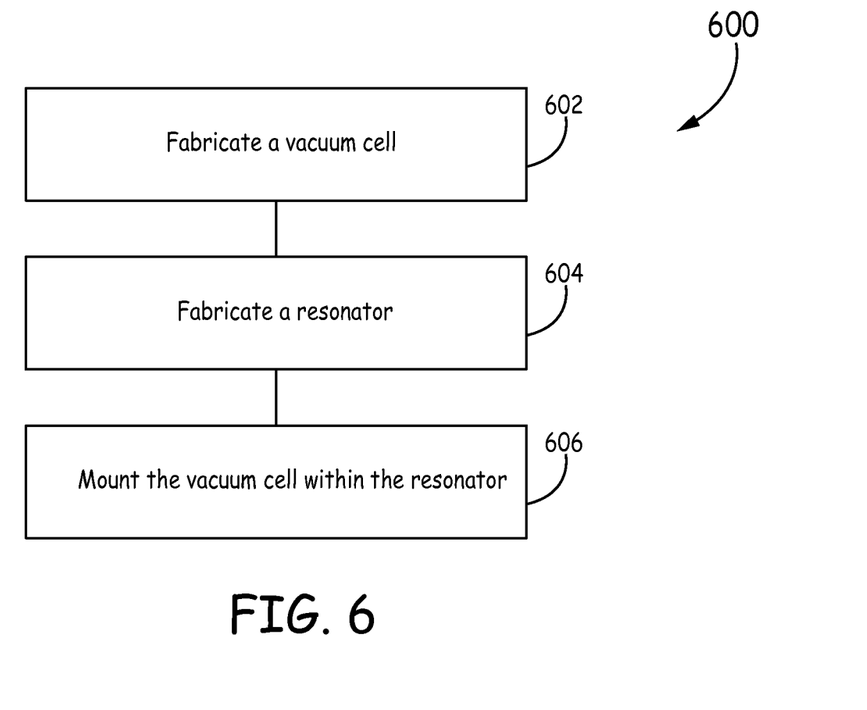
FIG. 6 is a flow diagram illustrating a method for fabricating an atomic clock in one embodiment described in the present disclosure.

FIG. 6 is a flow diagram of a method 600 for fabricating a physics package according to at least one embodiment. Method 600 proceeds at 602, where a vacuum cell is fabricated. For example, the vacuum cell is fabricated by forming two separate end portions and bonding the end portions to a hollow central cylinder, where the hollow central cylinder has two open ends on opposite sides of the cylinder and the end portions are bonded to the open ends of the central cylinder using a hermetic seal. The bonding of the end portions to the central cylinder encloses an enclosed volume within the vacuum cell. Further, when the central cylinder and the end portions are bonded to each other, the central cylinder and the end portions are in the presence of inert gasses. In at least one implementation, the inert gasses are pumped out by a vacuum pump connected to the cell via tubes such as vacuum connection 506 in FIG. 4. Atoms may then be liberated into the cell from a reservoir attached to the cell. In at least one implementation, the vacuum connection is left attached to the vacuum cell when the vacuum cell is used as an atomic clock.

Method 600 proceeds at 604, where a resonator is fabricated. The resonator is a device, which, when driven by a source of microwave energy, establishes a persistent microwave field within the resonator's interior volume. In at least one implementation, the resonator is a loop gap resonator that has been tuned to provide a homogenous microwave field at the resonant frequency of an electromagnetic transition between internal energy levels of the species of atoms contained within the vacuum cell. Method 600 then proceeds to 606, where a vacuum cell is mounted within the resonator. For example, the vacuum cell is mounted such that the resonator encircles the central cylinder and light sources are positioned such that laser light enters through the end portions of the vacuum cell to trap the atoms in the vacuum cell at the location where the lasers intersect within the vacuum cell. Further, the microwave fields generated by the resonator are able to probe the trapped atoms to provide measurements that are used when providing the reference frequency.

EXAMPLE EMBODIMENTS

Example 1 includes a cold atom microwave frequency standard comprising: a vacuum cell, the vacuum cell comprising: a central cylinder, the central cylinder being hollow and having a first open end and a second open end; a first end portion joined to the first open end; and a second end portion joined to the second open end, wherein the first end portion, the central cylinder, and the second end portion enclose a hollow volume containing atoms, the first end portion and the second end portion configured to allow light to enter into the hollow volume; and a cylindrically symmetric resonator encircling the central cylinder, wherein the resonator generates a microwave field in the hollow volume at the resonant frequency of the atoms.

Example 2 includes the cold atom frequency standard of Example 1, wherein the central cylinder has a circumference that is at least one of: circular; and polygonal.

Example 3 includes the cold atom frequency standard of any of Examples 1-2, wherein the vacuum cell further comprises at least one vacuum tube hermetically bonded to the vacuum cell, the at least one vacuum tube configured for at least one of: introducing solid material into the vacuum cell; and connecting to a vacuum, such that air is evacuated from the vacuum cell through the at least one vacuum tube.

Example 4 includes the cold atom frequency standard of any of Examples 1-3, wherein the resonator is a loop gap resonator.

Example 5 includes the cold atom frequency standard of any of Examples 1-4, further comprising a getter configured to evacuate gas from within the hollow volume.

Example 6 includes the cold atom frequency standard of any of Examples 1-5, wherein the resonator and vacuum cell are mounted within a frame, the frame comprising at least one light source to introduce a plurality of light beams into the hollow volume, wherein the plurality of light beams intersect within the hollow volume to trap the atoms.

Example 7 includes the cold atom frequency standard of any of Examples 1-6, wherein the atoms are rubidium atoms.

Example 8 includes a method for fabricating a frequency standard, the method comprising: fabricating a vacuum cell, wherein the vacuum cell comprises a hollow volume hermetically enclosing atoms; fabricating a resonator, wherein the resonator is configured to generate a microwave field at the resonant frequency of the atoms within an interior volume of the resonator; and mounting the vacuum cell within the resonator, wherein the vacuum cell is placed within the interior volume of the resonator such that a plurality of light beams may enter into the hollow volume to trap the atoms.

Example 9 includes the method of Example 8, wherein fabricating a vacuum cell comprises: fabricating a central cylinder, wherein the central cylinder encircles the hollow volume, the central cylinder having a first open end and a second open end opposite the first open end; fabricating a first end portion; fabricating a second end portion; and bonding the first end portion to the first open end and the second end portion to the second open end, wherein the atoms are hermetically sealed within the hollow volume.

Example 10 includes the method of Example 9, wherein the central cylinder is fabricated from a material that does not impede the transmission of radio frequency energy through the material.

Example 11 includes the method of any of Examples 9-10, wherein the first end portion and the second end portion are fabricated from a transparent material.

Example 12 includes the method of any of Examples 9-11, further comprising: fabricating a getter tube on the vacuum cell; and activating the getter.

Example 13 includes the method of any of Examples 9-12, wherein the first end portion is hermetically bonded to the first open end and the second end portion is hermetically bonded to the second open end in the presence of an inert gas.

Example 14 includes the method of any of Examples 9-13, wherein bonding the first end portion to the first open end and the second end portion to the second open end comprises anodically bonding the first end portion to the first open end and the second end portion to the second open end.

Example 15 includes the method of any of Examples 8-14, wherein the resonator is a loop gap resonator.

Example 16 includes the method of any of Examples 8-15, further comprising evacuating gas from within the hollow volume.

Example 17 includes the method of any of Examples 8-16, wherein mounting the vacuum cell within the resonator comprises mounting the vacuum cell and resonator on a frame that maintains the vacuum cell within the resonator.

Example 18 includes a frequency standard comprising: a vacuum cell, the vacuum cell comprising: a central cylinder, the central cylinder being hollow and having a first open end and a second open end; a first end portion joined to the first open end; and a second end portion joined to the second open end, wherein the first end portion, the central cylinder, and the second end portion hermetically enclose a hollow volume containing atoms, the first end portion and the second end portion configured to allow light to enter into the hollow volume; a resonator configured to generate a microwave field in the hollow volume at the resonant frequency of the atoms within an interior volume of the resonator; a frame configured to secure the vacuum cell within the resonator such that the central cylinder is encircled by the resonator; and at least one light source mounted to the frame, wherein the light source introduces a plurality of light beams that orthogonally intersect to trap the atoms within the hollow volume.

Example 19 includes the frequency standard of Example 18, wherein the resonator is a loop gap resonator.

Example 20 includes the frequency standard of any of Examples 18-19, wherein the first end portion and the second end portion are fabricated from a transparent material.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A cold atom microwave frequency standard comprising: a vacuum cell, the vacuum cell comprising:
    a central cylinder, the central cylinder being hollow and having a first open end and a second open end;
    a first end portion joined to the first open end; and
    a second end portion joined to the second open end, wherein the first end portion, the central cylinder, and the second end portion enclose a hollow volume containing atoms, the first end portion and the second end portion configured to allow light to enter into the hollow volume; and
    a cylindrically symmetric resonator encircling the central cylinder, the cylindrically symmetric resonator comprising a loop formed by electrodes that are separated by gaps, wherein the resonator generates a microwave field in the hollow volume at the resonant frequency of the atoms.

2. The cold atom frequency standard of claim 1, wherein the central cylinder has a circumference that is at least one of:
    circular; and
    polygonal.

3. The cold atom frequency standard of claim 1, wherein the vacuum cell further comprises at least one vacuum tube hermetically bonded to the vacuum cell, the at least one vacuum tube configured for at least one of:
    introducing solid material into the vacuum cell; and
    connecting to a vacuum, such that air is evacuated from the vacuum cell through the at least one vacuum tube.

4. The cold atom frequency standard of claim 1, further comprising a getter configured to evacuate gas from within the hollow volume.

5. The cold atom frequency standard of claim 1, wherein the resonator and vacuum cell are mounted within a frame, the frame comprising at least one light source to introduce a plurality of light beams into the hollow volume, wherein the plurality of light beams intersect within the hollow volume to trap the atoms.

6. The cold atom frequency standard of claim 1, wherein the atoms are rubidium atoms.

7. A method for fabricating a frequency standard, the method comprising:
    fabricating a vacuum cell, wherein the vacuum cell comprises a hollow volume hermetically enclosing atoms;
    fabricating a resonator, the resonator comprising a loop formed by electrodes that are separated by gaps, wherein the resonator is configured to generate a microwave field at the resonant frequency of the atoms within an interior volume of the resonator; and
    mounting the vacuum cell within the resonator, wherein the vacuum cell is placed within the interior volume of the resonator such that a plurality of light beams may enter into the hollow volume to trap the atoms.

8. The method of claim 7, wherein fabricating a vacuum cell comprises:
    fabricating a central cylinder, wherein the central cylinder encircles the hollow volume, the central cylinder having a first open end and a second open end opposite the first open end;
    fabricating a first end portion;
    fabricating a second end portion; and
    bonding the first end portion to the first open end and the second end portion to the second open end, wherein the atoms are hermetically sealed within the hollow volume.

9. The method of claim 8, wherein the central cylinder is fabricated from a material that does not impede the transmission of radio frequency energy through the material.

10. The method of claim 8, wherein the first end portion and the second end portion are fabricated from a transparent material.

11. The method of claim 8, further comprising:
    fabricating a getter tube on the vacuum cell; and
    activating the getter.

12. The method of claim 8, wherein the first end portion is hermetically bonded to the first open end and the second end portion is hermetically bonded to the second open end in the presence of an inert gas.

13. The method of claim 8, wherein bonding the first end portion to the first open end and the second end portion to the second open end comprises anodically bonding the first end portion to the first open end and the second end portion to the second open end.

14. The method of claim 7, further comprising evacuating gas from within the hollow volume.

15. The method of claim 7, wherein mounting the vacuum cell within the resonator comprises mounting the vacuum cell and resonator on a frame that maintains the vacuum cell within the resonator.

16. A frequency standard comprising:
a vacuum cell, the vacuum cell comprising:
- a central cylinder, the central cylinder being hollow and having a first open end and a second open end;
- a first end portion joined to the first open end; and
- a second end portion joined to the second open end, wherein the first end portion, the central cylinder, and the second end portion hermetically enclose a hollow volume containing atoms, the first end portion and the second end portion configured to allow light to enter into the hollow volume;

a resonator configured to generate a microwave field in the hollow volume at the resonant frequency of the atoms within an interior volume of the resonator, the resonator comprising a loop formed by electrodes that are separated by gaps;

a frame configured to secure the vacuum cell within the resonator such that the central cylinder is encircled by the resonator; and at least one light source mounted to the frame, wherein the light source introduces a plurality of light beams that orthogonally intersect to trap the atoms within the hollow volume.

17. The frequency standard of claim 16, wherein the first end portion and the second end portion are fabricated from a transparent material.

* * * * *